(12) United States Patent
Nguyen

(10) Patent No.: US 9,798,099 B2
(45) Date of Patent: Oct. 24, 2017

(54) LATCH FOR COMMUNICATION MODULE

(71) Applicant: Finisar Corporation, Sunnyvale, CA (US)

(72) Inventor: Long Van Nguyen, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 15/083,684

(22) Filed: Mar. 29, 2016

(65) Prior Publication Data

US 2016/0291273 A1    Oct. 6, 2016

Related U.S. Application Data

(60) Provisional application No. 62/140,614, filed on Mar. 31, 2015.

(51) Int. Cl.
*G02B 6/42* (2006.01)
*H05K 1/11* (2006.01)

(52) U.S. Cl.
CPC .......... *G02B 6/4284* (2013.01); *G02B 6/428* (2013.01); *G02B 6/4269* (2013.01); *H05K 1/117* (2013.01)

(58) Field of Classification Search
CPC .. G02B 6/4201; G02B 6/4219; G02B 6/4228; G02B 6/423; G02B 6/4246; G02B 6/4249; G02B 6/4256; G02B 6/426; G02B 6/4261; G02B 6/4266; G02B 6/4268; G02B 6/4269; G02B 6/4278; G02B 6/428; G02B 6/4292; G02B 6/4284; H05K 1/117
See application file for complete search history.

(56) References Cited

U.S. PATENT DOCUMENTS

| | | | |
|---|---|---|---|
| 6,908,323 B2 | 6/2005 | Ice | |
| 9,309,908 B2 * | 4/2016 | Shi | ......... G02B 6/4246 |
| 2014/0126957 A1 * | 5/2014 | Shi | ......... G02B 6/4246 403/322.1 |

* cited by examiner

*Primary Examiner* — John M Bedtelyon
(74) *Attorney, Agent, or Firm* — Maschoff Brennan

(57) ABSTRACT

A communication module includes a printed circuit board, a housing including a left and right sidewall, a top and bottom panel, and a catch pin extending from the bottom panel, the housing enclosing the circuit board and configured to be inserted into and removed from the host device, and a delatch assembly slidably engaged with the bottom panel of the housing, including first and second delatch arms extending underneath the bottom panel of the housing and configured to removably engage with the host device, and a delatch cross-member extending underneath the bottom panel of the housing, including a hooking member configured to selectively engage the catch pin as the delatch assembly slides along the housing.

20 Claims, 19 Drawing Sheets

LATCH FOR COMMUNICATION MODULE

CROSS-REFERENCE TO RELATED APPLICATION

This patent application claims the benefit of and priority to U.S. Provisional App. No. 62/140,614, filed Mar. 31, 2015, which is incorporated herein by reference.

BACKGROUND

1. Field

Embodiments disclosed herein relate generally to latch mechanisms for communication modules.

2. Related Technology

Fiber-optic transmission media are increasingly used for transmitting optical, voice, and data signals. As a transmission vehicle, light provides a number of advantages over traditional electrical communication techniques. For example, optical signals enable extremely high transmission rates and very high bandwidth capabilities. Also, optical signals are unaffected by electromagnetic radiation that causes electromagnetic interference ("EMI") in electrical signals. Optical signals also provide a more secure signal because the optical transmission medium, such as an optical fiber, does not allow portions of the signal to escape, or be tapped, from the optical fiber, as can occur with electrical signals in wire-based transmission systems. Optical signals can also be transmitted over relatively greater distances without experiencing the signal loss typically associated with transmission of electrical signals over such distances.

While optical communications provide a number of advantages, the use of light as a data transmission vehicle presents a number of implementation challenges. For example, prior to being received and/or processed, the data represented by the optical signal must be converted to an electrical form. Similarly, the data signal must be converted from an electronic form to an optical form prior to transmission onto the optical network.

These conversion processes may be implemented by optoelectronic communication modules (hereinafter "communication module" or "communication modules") located at either end of an optical fiber. A typical communication module includes a laser transmitter circuit capable of converting electrical signals to optical signals, and an optical receiver capable of converting received optical signals into electrical signals. The communication module may be electrically interfaced with a host device, such as a host computer, switching hub, network router, switch box, or computer I/O, via a compatible connection port.

In some applications, it is desirable to miniaturize the communication module as much as possible to increase the port density. Generally, port density refers to the number of network connections within a given physical space, so that a relative increase in the number of such network connections within the defined physical space corresponds to a relative increase in port density. Because the communication modules occupy a significant amount of space on the host device, a higher port density may be achieved by reducing the physical space needed for each communication module.

In addition, it is desirable in many applications for the communication module to be "hot-pluggable," which means that the communication module may be inserted and removed from the host system without securing the electrical power to the communication module or host. In an attempt to accomplish many of these objectives, international and industry standards have been adopted that control the physical size and shape of communication modules. Among other things, such standards help to ensure compatibility between systems and components produced by different manufacturers.

Communication modules may be provided in a variety of form factors, depending upon the specific application for which they are needed. A considerable number of industries and applications commonly specify a communication module designed to be plugged into a corresponding port of a host device. On one end of the corresponding port is a "right angle" surface-mount connector that fits through a bottom rear end opening of the port. The surface-mount connector is also connected to the host board. The rear end of the communication module includes a printed circuit board having a card-edge connector. This card-edge connector mechanically and electrically interfaces with the host signal interface, which includes the aforementioned surface-mount connector as well as associated high-speed interconnects.

Pluggable communication modules may be furnished in a range of sizes to meet different specifications. Regardless of their sizes, however, the communication modules must be capable of being latched and unlatched to the port of the host device. If the communication module is not securely and reliably latched to the port, the card-edge connector of the communication module may disengage and disrupt transmission or reception of the data signal. The communication module should also be capable of being unlatched and removed in the event that the communication module requires repair, testing, or replacement.

The subject matter claimed herein is not limited to embodiments that solve any disadvantages or that operate only in environments such as those described above. Rather, this background is only provided to illustrate one technology area where some embodiments described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to latch mechanisms for optoelectronic communication modules (hereinafter "communication modules").

A communication module may include a printed circuit board that includes an edge connector configured to electrically interface the communication module with a host device that includes a port to receive the communication module; a housing that includes a left sidewall, a right sidewall, a top panel, a bottom panel, and a catch pin that extends from the bottom panel, the housing at least partially encloses the printed circuit board; and a delatch assembly slidably engaged with the bottom panel of the housing. The delatch assembly may include a first delatch arm that extends longitudinally underneath the bottom panel of the housing; a second delatch arm spaced apart from the first delatch arm that extends longitudinally underneath the bottom panel of the housing; a delatch cross-member that extends laterally underneath the bottom panel of the housing between the first delatch arm and the second delatch arm; and a hooking member coupled to the delatch cross-member and configured to selectively engage the catch pin as the delatch assembly slides along the housing. The first and second delatch arms may be configured to selectively disengage the communication module from the port of the host device.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Figure 1:
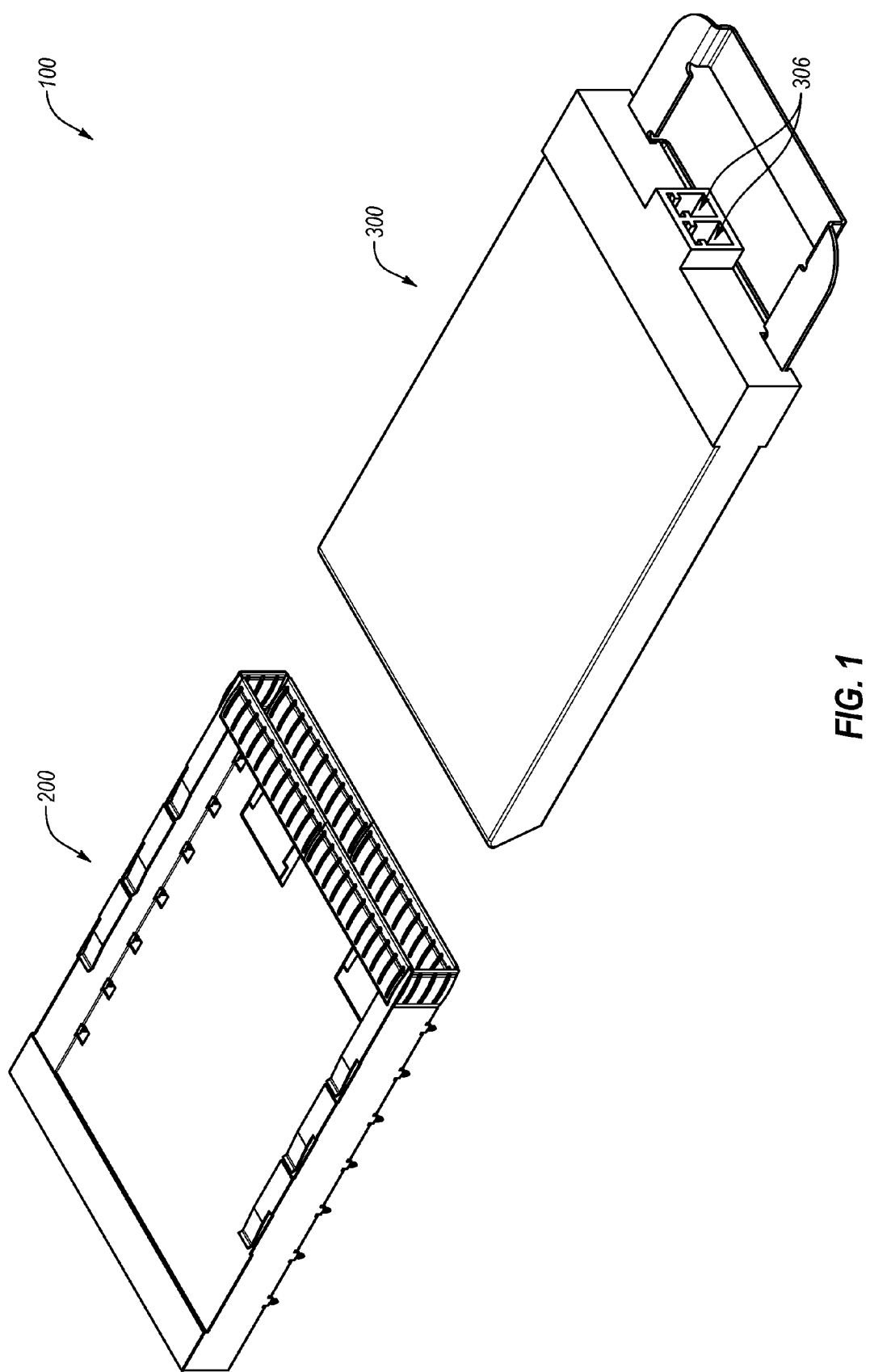
FIG. 1 is a partially exploded perspective view of an optical communication system that includes an optoelectronic communication module (hereinafter "communication module") and host device.

Particular embodiments of the present disclosure will be described with reference to the accompanying drawings. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of configurations, all of which are explicitly contemplated herein.

Smaller pluggable communication modules such as the XFP module may be supported by delatch assemblies disposed along the sidewalls of the module, such as the latch mechanism of U.S. Pat. No. 6,908,323, which is incorporated herein by reference. However, larger communication modules, such as the C form-factor pluggable (CFP) or 400 Gigabyte pluggable (CDP) modules, may be too large and too heavy to be adequately supported by side-mounted latch mechanisms. The CFP and CDP modules comply with specifications provided by multi-source agreements (herein, "MSA"), associations of companies that develop specifications for communication modules having compatible mechanical and electrical features. Accordingly, a delatch assembly for CFP and CDP modules must provide adequate support of the communication module and permit removal from a host device while complying within the dimensions defined by the MSA and enabling secure and reliable connectivity to the host device.

At least some larger communication modules utilize thumbscrews as a delatch assembly to facilitate secure engagement of the communication module to a host device. The thumbscrews are typically located one along each of two opposite sides of the communication module. Although the thumbscrews provide adequate support for the heavier communication modules, accommodating the installation of thumbscrews necessitates a reduction in the available space that could otherwise be used to house circuitry or other more critical electrical or optical components. Using thumbscrews may also be relatively inconvenient or even difficult for a user, as the screws must be screwed or unscrewed whenever a communication module needs to be inserted or removed from the host device. Furthermore, securement of the communication modules by thumbscrews may be ineffective at protecting the critical components of the communication module against gravitational shock and vibration.

In general, the described embodiments relate to a delatch assembly suitable for use on an optoelectronic communication module, such as an optoelectronic transceiver, to releasably secure the communication module within a port of a host device. Moreover, the delatch assembly may be implemented within communication modules that conform to industry standards, such as CFP or CDP or other relatively large communication modules. Alternatively or additionally, the delatch assembly may be implemented within communication modules that conform to other industry standards, such as small form factor pluggable (SFP), SFP+, XFP, or other relatively small communication modules. The delatch assembly may permit easy insertion and extraction of the communication module by a user, even when the communication module is used in a host device having a higher-density port configuration than otherwise permitted with communication modules that have side-mounted thumb screws.

According to some aspects, extraction of the communication module may be accomplished without the use of a specialized extraction tool, and can be performed without disturbing adjacent communication modules and cables.

Although the disclosed embodiments are described in the context of optoelectronic communication modules used in the field of optical networking, it will be appreciated that embodiments may be employed in other fields and/or operating environments where the functionality disclosed herein may be useful, such as in the context of electrical communication modules. Accordingly, the scope of the described embodiments should not be construed to be limited to the implementations and operating environments disclosed herein.

Embodiments of the present disclosure will now be explained with reference to the accompanying figures.

Reference is first made to FIG. 1, which illustrates a partially exploded view of an optical communication system 100 (hereinafter "system 100"), arranged in accordance with at least some embodiments described herein. The system 100 includes an optoelectronic communication module 300 (hereinafter "communication module") and a host device including a port 200. The host device may be configured to receive, and operably interact with, the communication module 300, by way of the port 200. The host device may further include, e.g., a printed circuit board and a heatsink. The heatsink may be positioned over the port 200 so as to dissipate heat generated by operation of the communication module 300. The communication module 300 may be communicatively coupled through the port 200 to the printed circuit board of the host device. The communication module 300 may include an optoelectronic transceiver or transponder module or other suitable communication module.

Figure 2A:
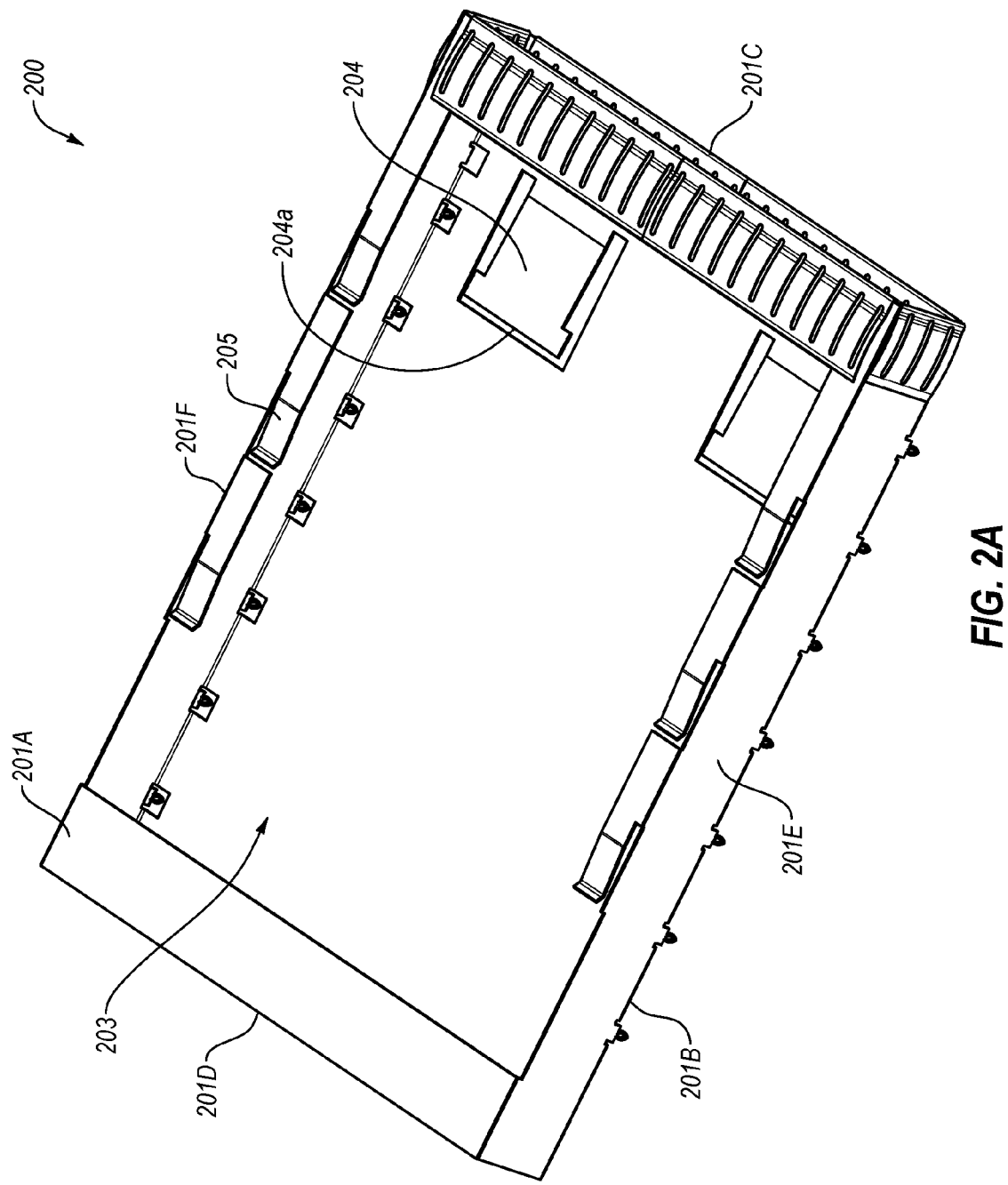
FIG. 2A is a top perspective view of an example port of an example host device.
Figure 2B:
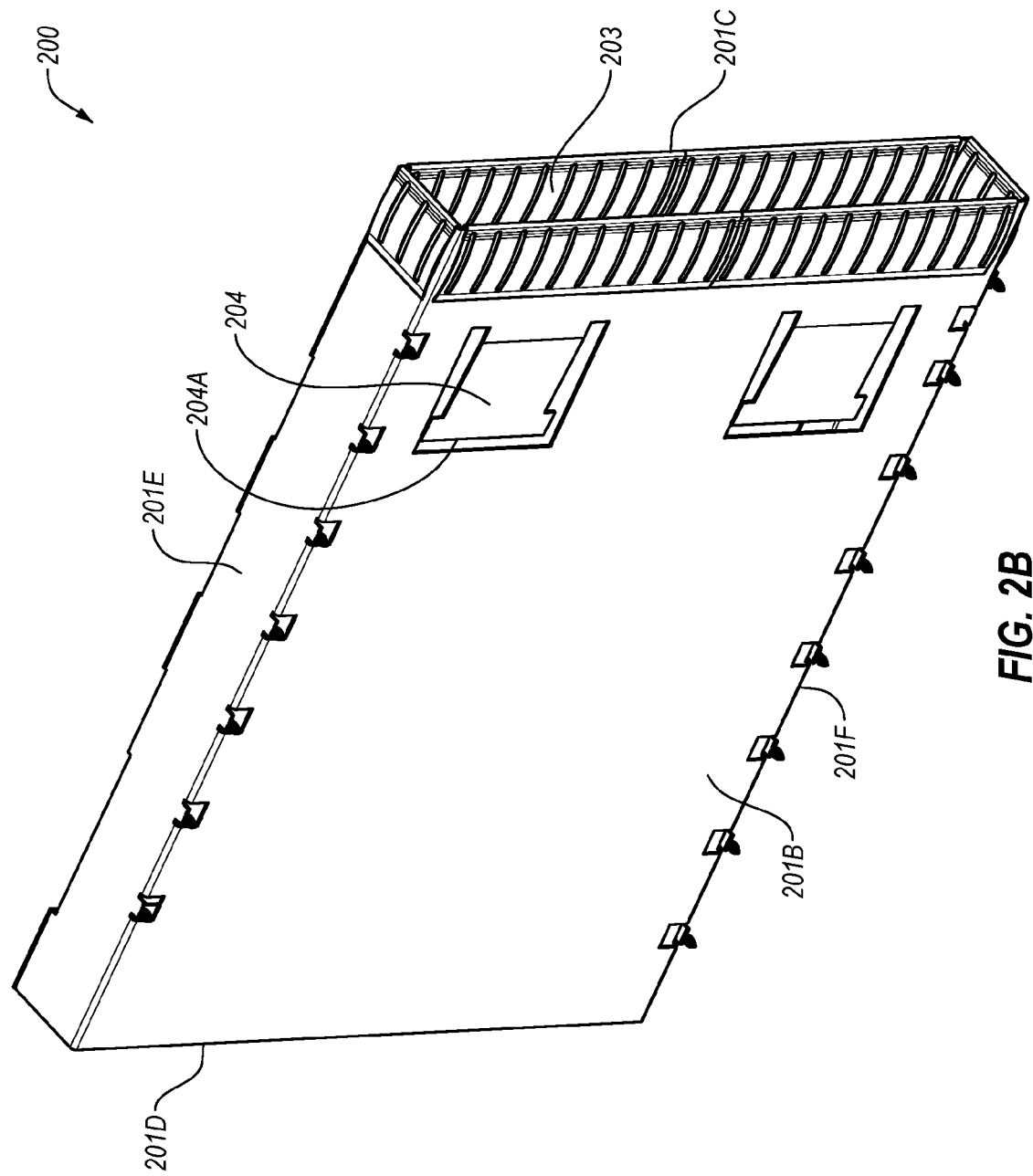
FIG. 2B is a bottom perspective view of the port of FIG. 2A.

Referencing FIGS. 2A and 2B, the port 200, arranged in accordance with at least one embodiment described herein, may be defined by a top panel 201A, a bottom panel 201B, a front face 201C, a rear face 201D, a left sidewall 201E, and a right sidewall 201F, and may be dimensioned to fit snugly around a housing 301 (see, e.g., FIG. 3A) of the communication module 300 when the communication module 300 (see, e.g., FIG. 3A) is plugged into the port 200, described in further detail below. The top panel 201A, bottom panel 201B, front face 201C, rear face 201D, left sidewall 201E, and right sidewall 201F generally define a cavity 203.

The port 200 may additionally include two resilient tabs 204 that may extend from the bottom panel 201B upward into the cavity 203. The operation of the tabs 204 may generally include the tabs 204 resiliently deflecting downward during insertion and removal of the communication module 300 before returning to extend upward into the cavity 203 and will be described in more detail below.

Alternatively or additionally, the port 200 may further include integrated heatsink springs 205. The integrated heatsink springs 205 may be configured to bias a heatsink (not shown) downward against a top of the communication module 300 to facilitate thermal energy transfer from the communication module 300 to the heatsink.

Figure 3A:
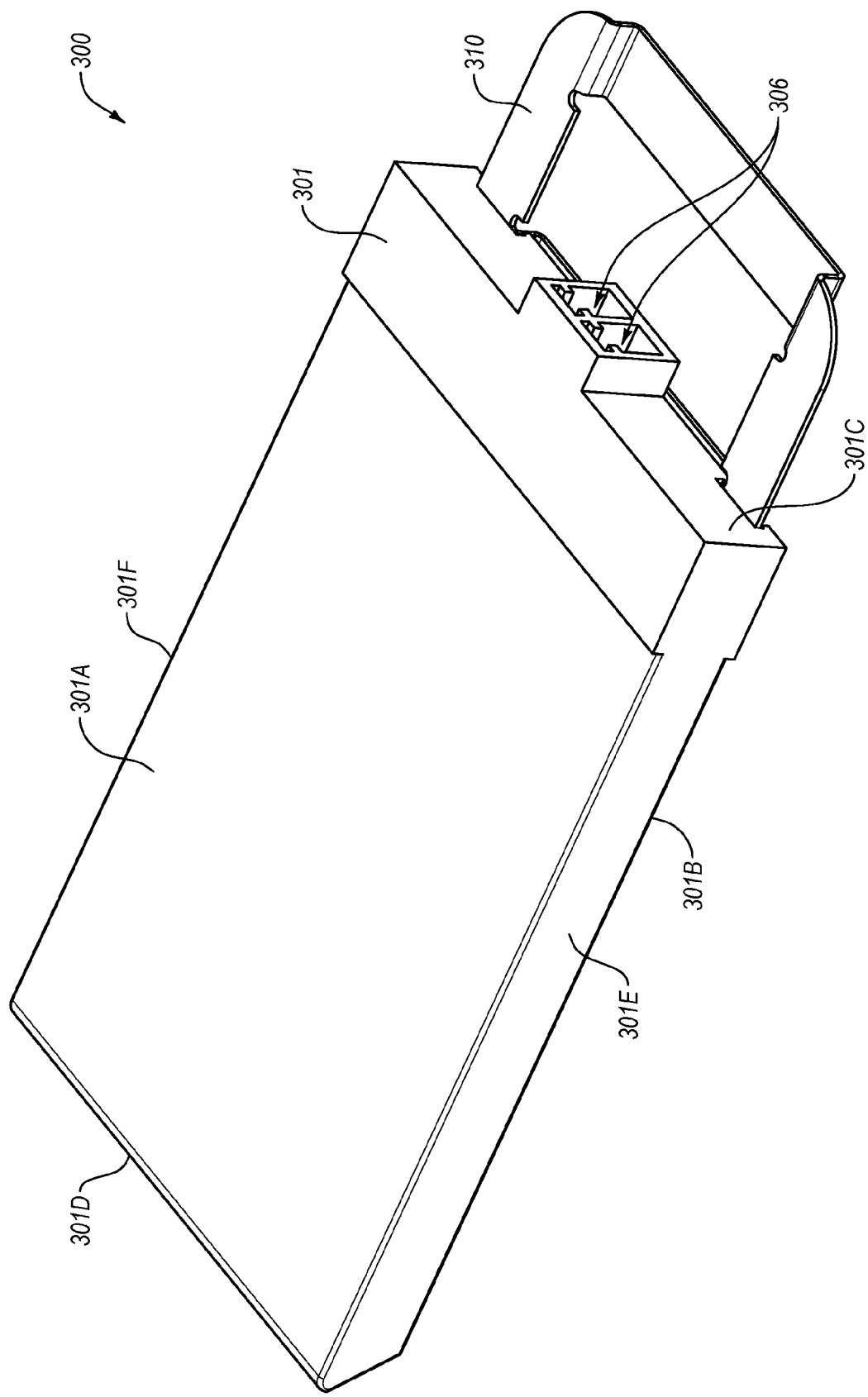
FIG. 3A is a top perspective view of an example communication module that includes a housing and a delatch assembly.
Figure 3B:
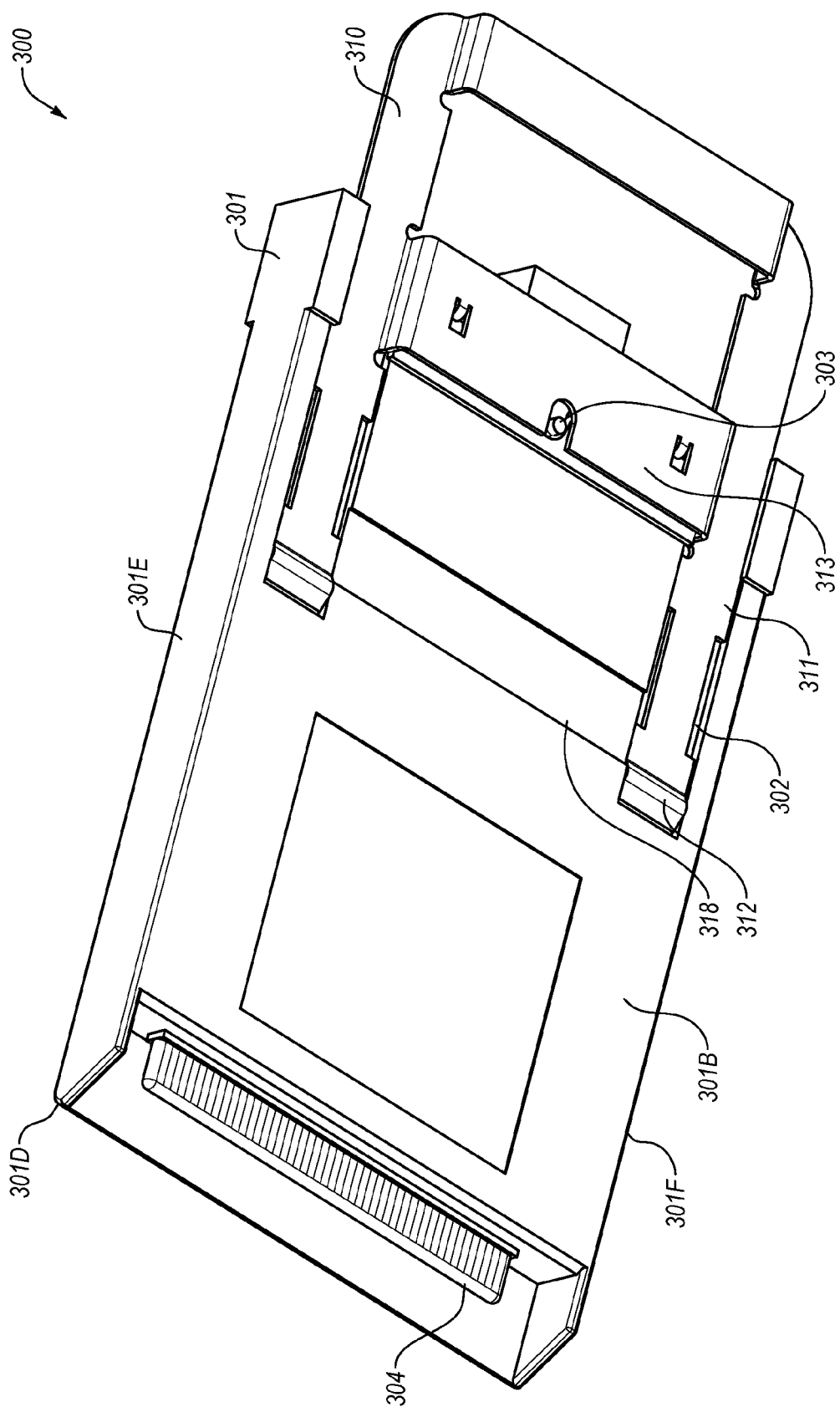
FIG. 3B is a bottom perspective view of the communication module of FIG. 3A.
Figure 4A:
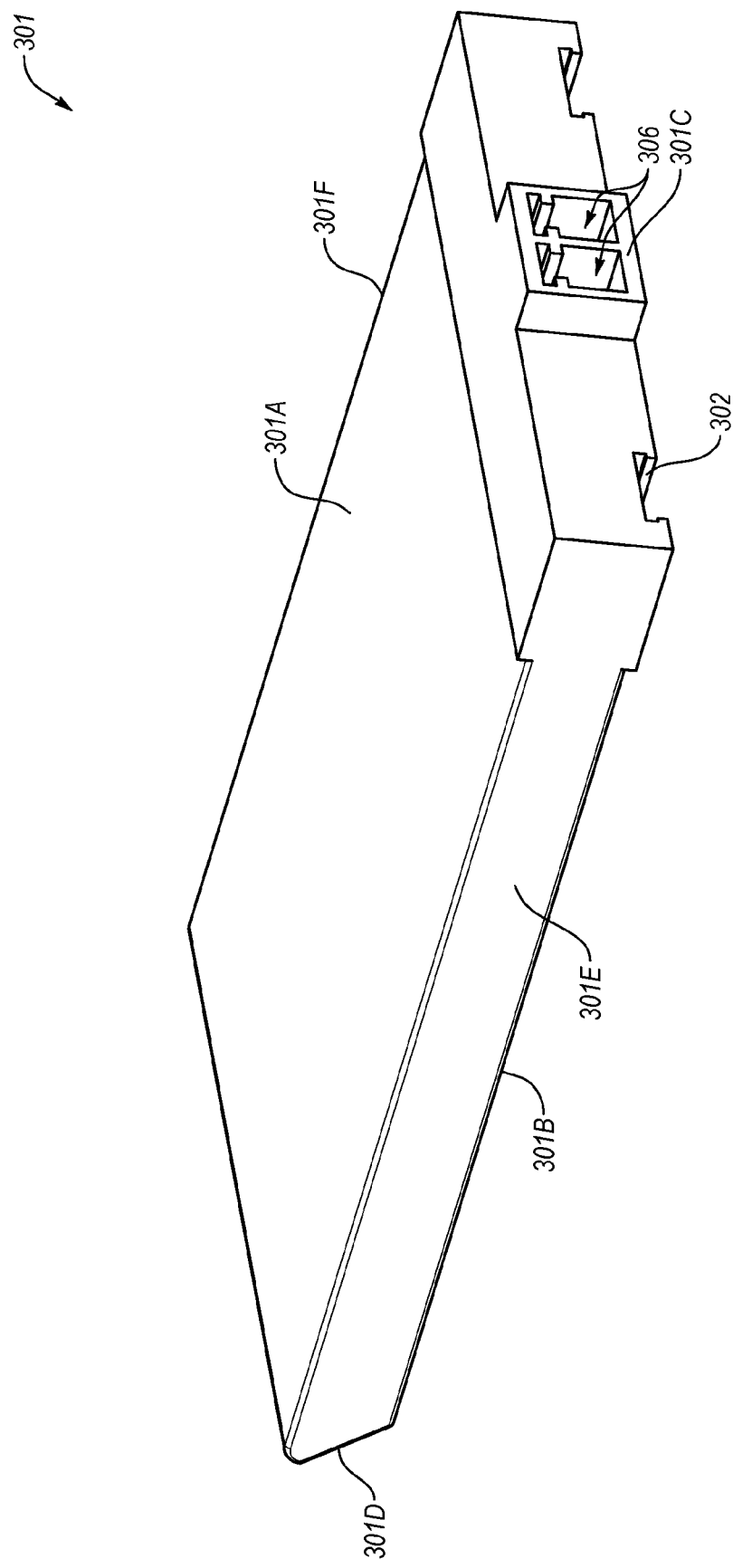
FIG. 4A is a side perspective view of the housing of the communication module of FIG. 3A.
Figure 4B:
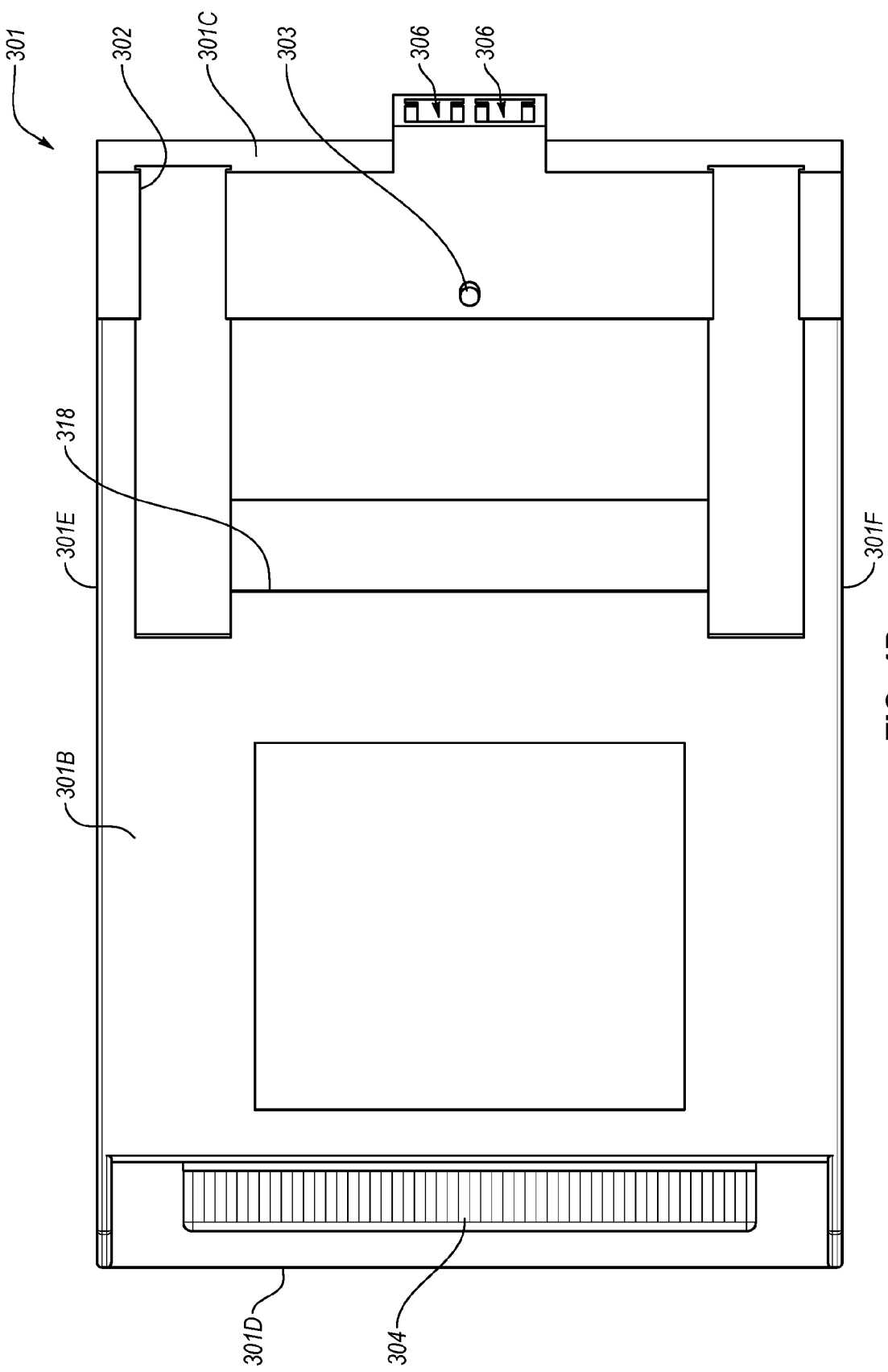
FIG. 4B is a bottom view of the housing of FIG. 4A.
Figure 5A:
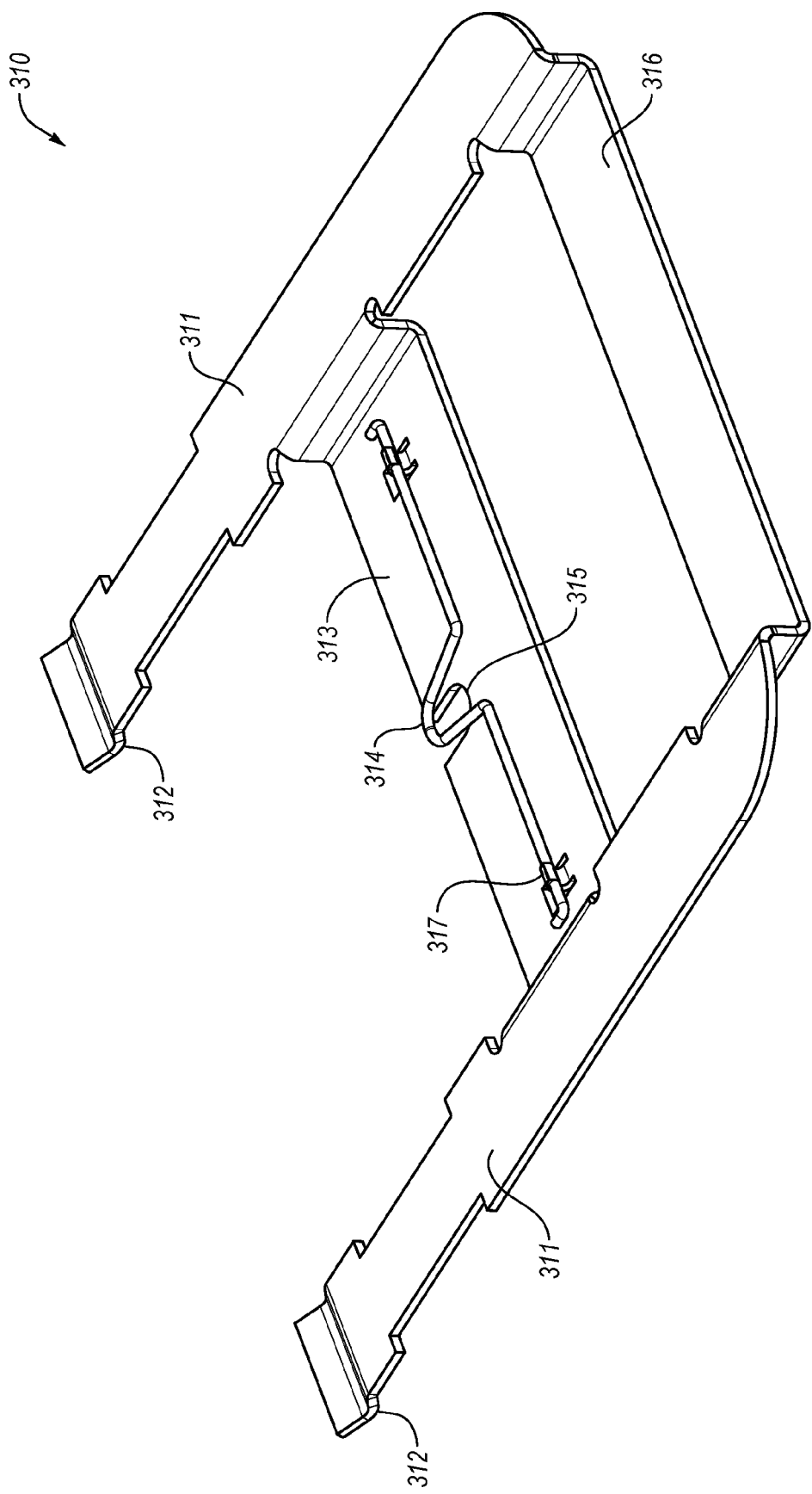
FIG. 5A is a top perspective view of the delatch assembly of the communication module of FIG. 3A.
Figure 5B:
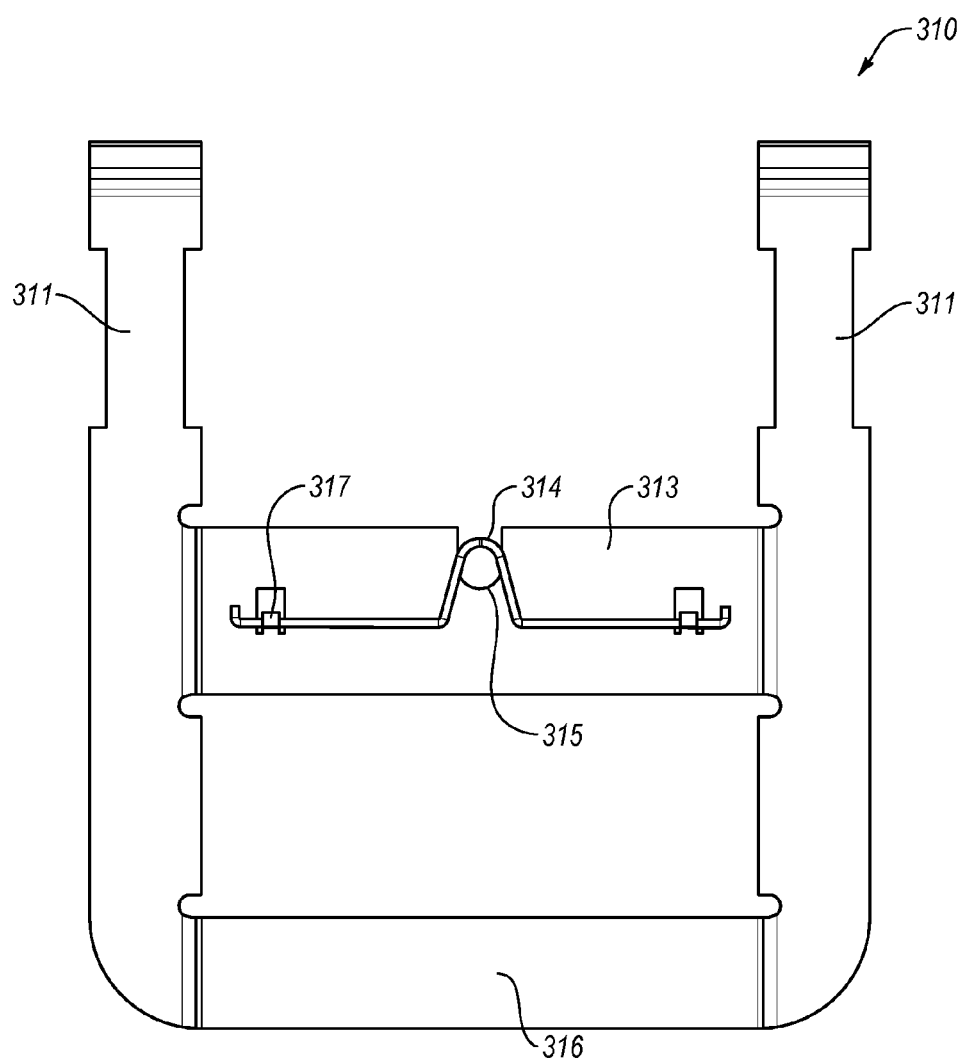
FIG. 5B is a top view of the delatch assembly of FIG. 5A.
Figure 5C:
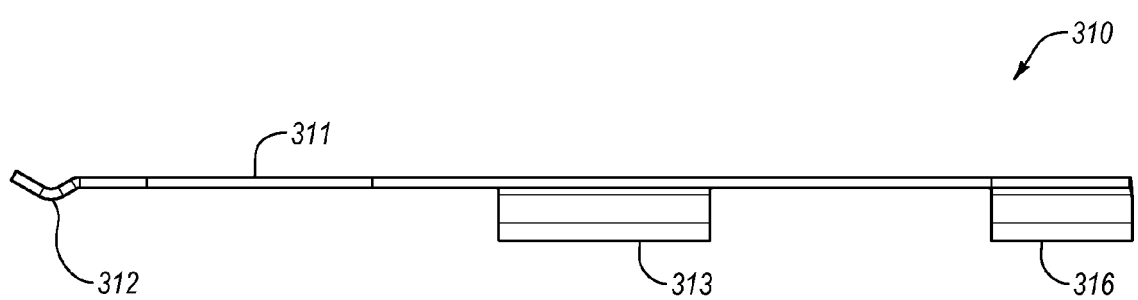
FIG. 5C is a side view of the delatch assembly of FIG. 5A.

Referencing FIGS. 3A and 3B, the communication module 300 may transmit and receive optical signals over transmission media such as fiber-optic cables (not shown). The communication module 300, arranged in accordance with at least one embodiment described herein, may include a housing 301 (see FIGS. 4A and 4B) and a delatch assembly 310 (see FIGS. 5A-5C).

With combined reference to FIGS. 3A-4B, the housing 301 may include a top panel 301A, a bottom panel 301B, a front face 301C, a rear face 301D, a left sidewall 301E, and a right sidewall 301F. The bottom panel 301B may define a pair of arm guides 302 or channels configured to slidingly receive delatch arms 311 of the delatch assembly 310 (see FIGS. 5A-5C) with the housing 301. The bottom panel 301B of the housing 301 includes a shelf 318 that faces frontward, e.g., toward the front face 301C. The arm guides 302 terminate rearward of the shelf 318. A catch pin 303 (FIG. 4B) may extend outward from the bottom panel 301B. Here and elsewhere in the discussion that follows, terms such as frontward, front, rearward, rear, upward, top, downward, bottom, and similar directional terms may be determined consistent with the directions implicit in the names of the top panel 301A, the bottom panel 301B, the front face 301C, and the rear face 301D.

The communication module 400 may include a printed circuit board (not shown) generally enclosed by the housing 301. An edge connector 304 of the printed circuit board may be operably disposed along the rear face 301D of the housing 301. The edge connector 304 may be configured to enable communication between the communication module 300 and the host device by electrically interfacing with the host device, e.g., through an opening or connector of the port 200. More particularly, the communication module 300 may receive, from the port 200, one or more electrical data signals that are to be transmitted as one or more optical signals. Likewise, the communication module 300 may receive data in optical form, and convert and send it to the host device by way of the port 200 in electrical form. Various components configured to transmit and receive optical signals (not shown) may be stored within the housing 301, such as a receive optical subassembly ("ROSA") and/or a transmit optical subassembly ("TOSA").

In addition to the aforementioned components, example implementations of the communication module 300 may include optical cable ports 306 disposed along the front face 301C of the housing 301, configured to receive connectors of fiber-optic cables. Examples of fiber-optic connectors which the optical cable ports 306 may be configured to receive may include Lucent Connectors (LC), Subscriber Connectors (SC), Multiple-Fiber Push-On Connectors (MPO), or any other fiber-optic cable connectors.

As shown in FIGS. 3A-3B, the communication module 300 may include the delatch assembly 310 slidably coupled to the bottom panel 301B of the housing 301. With combined reference to FIGS. 3A-3B and 5A-5C, the delatch assembly 310 may include a pair of delatch arms 311 extending parallel to one another and connected by a delatch cross-member 313. Each delatch arm 311 may include a ramp 312 configured to interact with a corresponding one of the resilient tabs 204 of the port 200, described in more detail below. The ramps 312 are sometimes referred to as latch follower delatching cam features, or some variation thereof. The delatch cross-member 313 may include a hooking member 314 removably coupled to the delatch cross-member 313 by hooks 317. The delatch cross-member 313 may define a hooking slot 315. The hooking member 314 and the hooking slot 315 may be configured to selectively engage the catch pin 303 as the delatch assembly 310 slides with respect to the housing 301 to confine sliding motion of the delatch assembly 310 relative to the housing 301 to a predefined range, described in more detail below. The delatch assembly 310 may also include a delatch handle 316 to facilitate the insertion and extraction of the communication module 300 from the port 200.

In the illustrated embodiment of the delatch assembly 310, the delatch arms 311, the delatch cross-member 313, and the delatch handle 316 may be formed as a single part. This arrangement may provide the benefit of reduced assembly cost and increased mechanical robustness. The delatch handle 316 may include a flat top surface that may also provide a surface for the application of graphic elements to facilitate the categorization and organization of different communication modules 300.

With respect to the implementations illustrated in the Figures, it should be noted that such implementations are not intended to limit the scope of the described embodiments. Any other structural arrangement that is effective in providing functionality comparable to that implemented by the above embodiment may alternatively be employed.

For example, FIGS. 6A-6E illustrate alternative embodiments of an optoelectronic communication module 400 (hereinafter "communication module 400") including a housing 401, a delatch assembly 410, and a bail assembly 420. The housing 401 (FIGS. 6C and 6D) may include a top panel 401A, a bottom panel 401B, a front face 401C, a rear face 401D, a left sidewall 401E, and a right sidewall 401F. The bottom panel 401B may define a pair of arm guides 402 configured to slidingly receive delatch arms 411 of the delatch assembly 410 with the housing 401. The bottom panel 401B of the housing 401 includes a shelf 418 that faces frontward. The arm guides 402 terminate rearward of the shelf 418. A catch pin 403 may extend from the bottom panel 401B, a left sidewall pin 404E may extend from the left sidewall 401E, and a right sidewall pin 404F may extend from the right sidewall 401F.

Figure 6A:
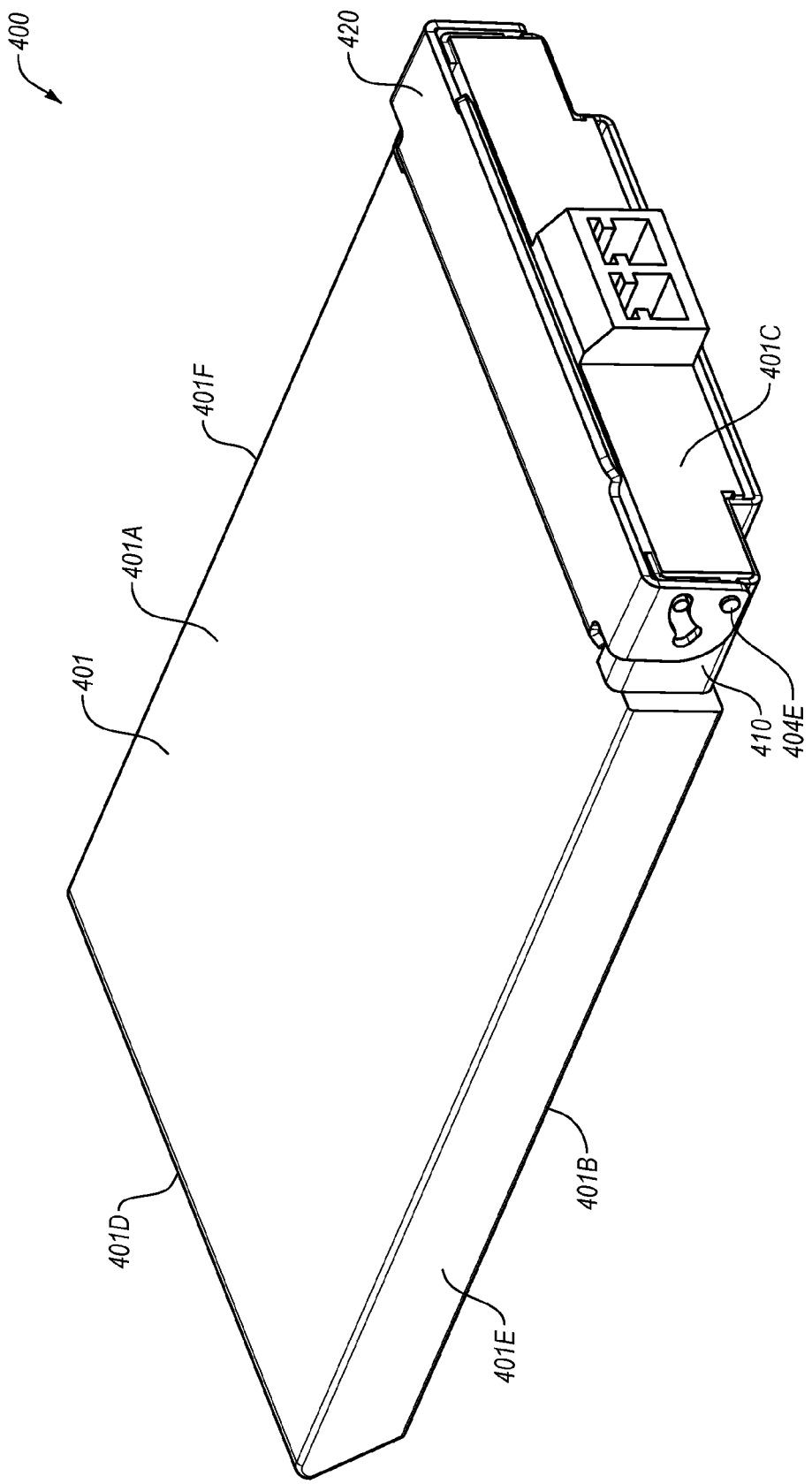
FIG. 6A is a side perspective view of an alternative example communication module that includes a housing, delatch assembly, and bail assembly.
Figure 6B:
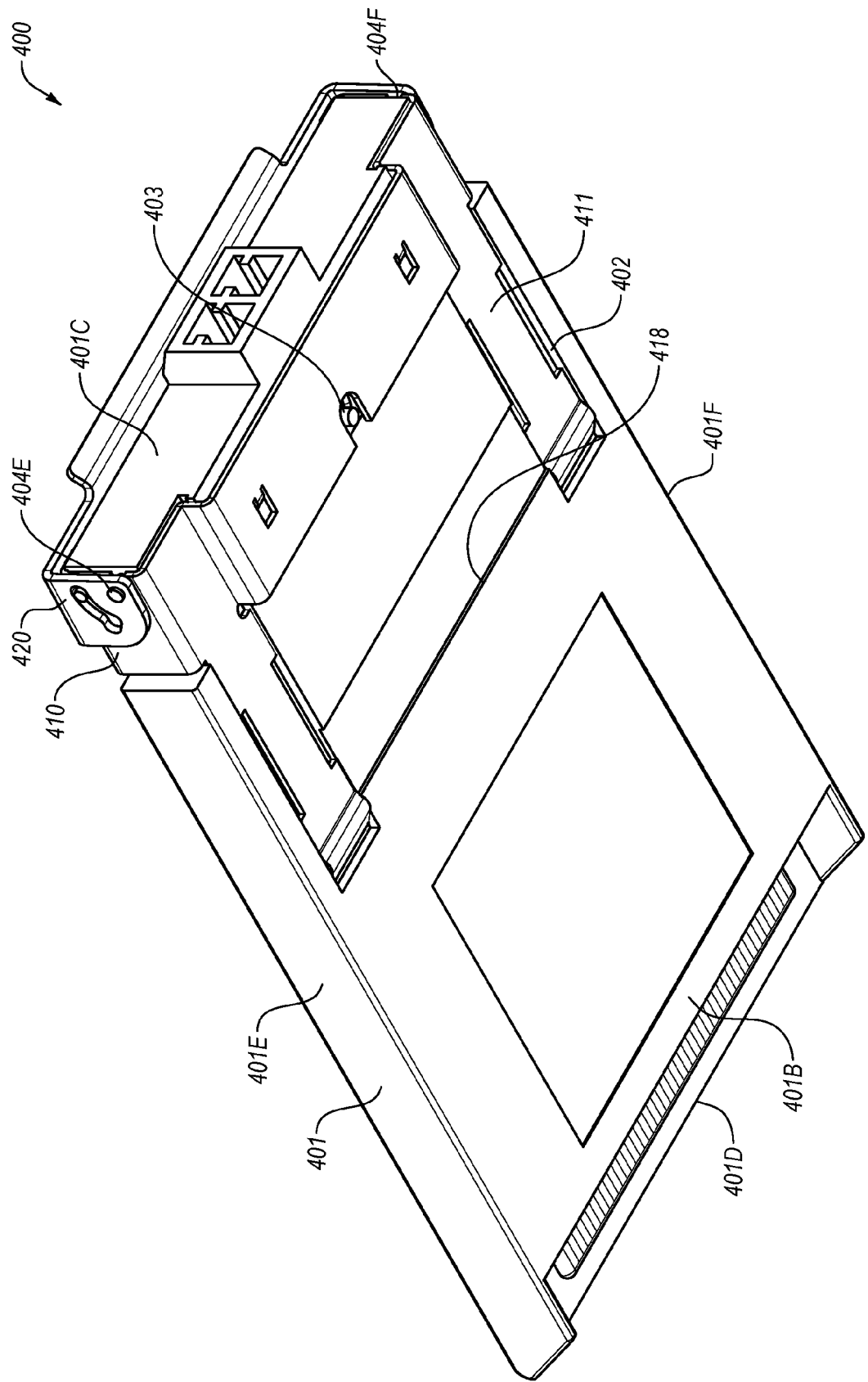
FIG. 6B is a bottom perspective view of the communication module of FIG. 6A.
Figure 6C:
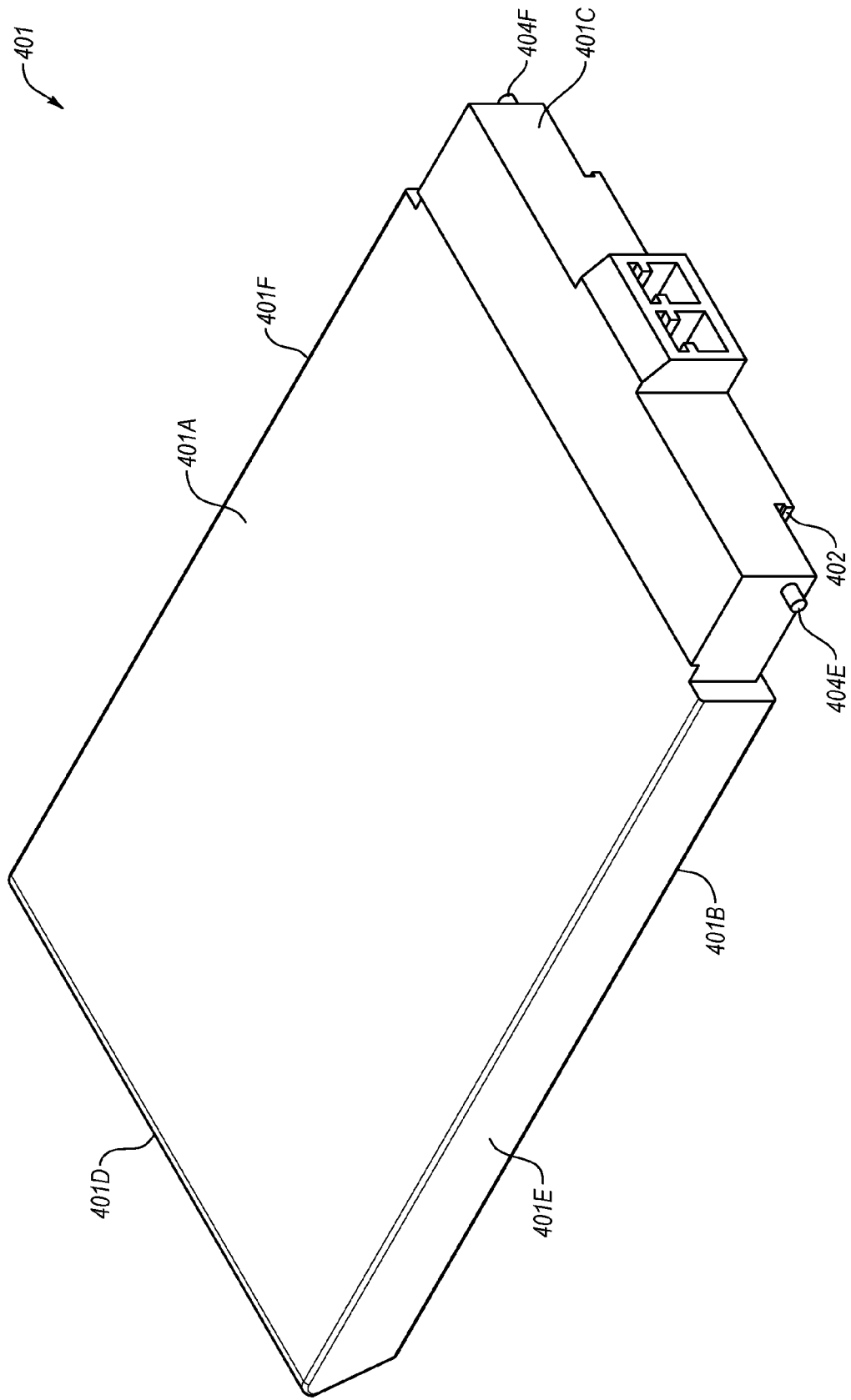
FIG. 6C is a top perspective view of the housing of the communication module of FIG. 6A.
Figure 6D:
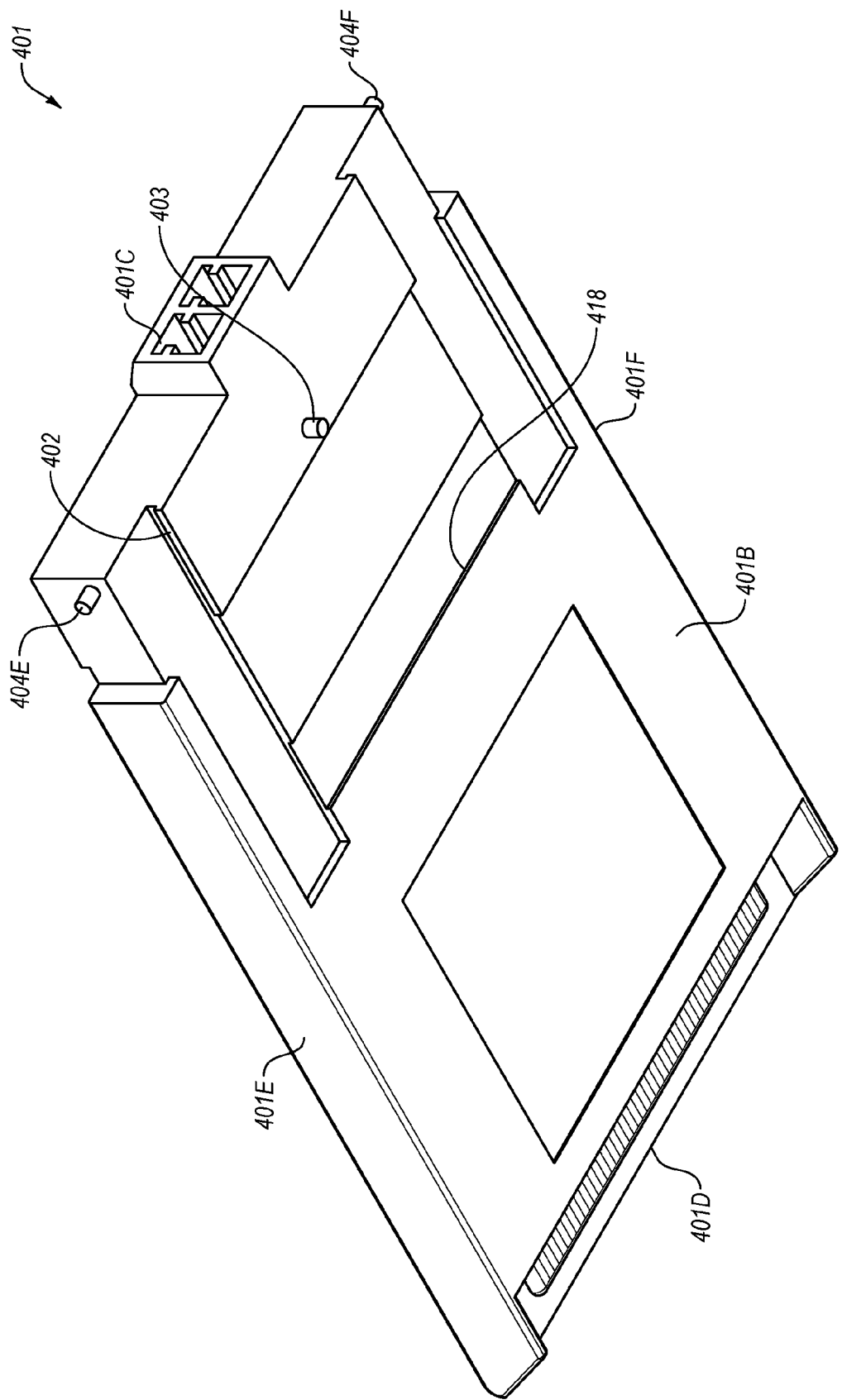
FIG. 6D is a bottom perspective view of the housing of FIG. 6C.
Figure 6E:
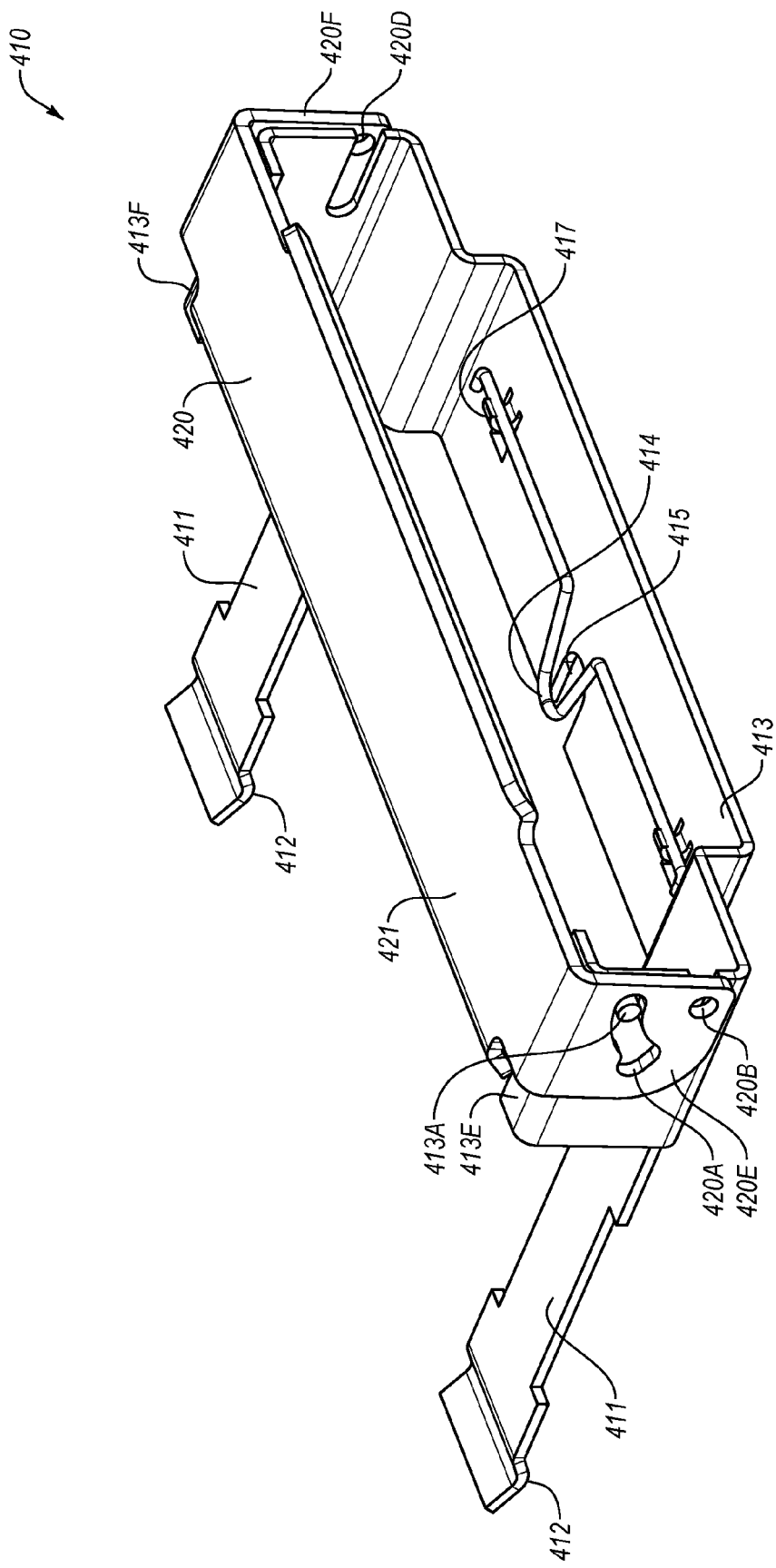
FIG. 6E is a top perspective view of the delatch assembly and bail assembly of the communication module of FIG. 6A.
Figure 6F:
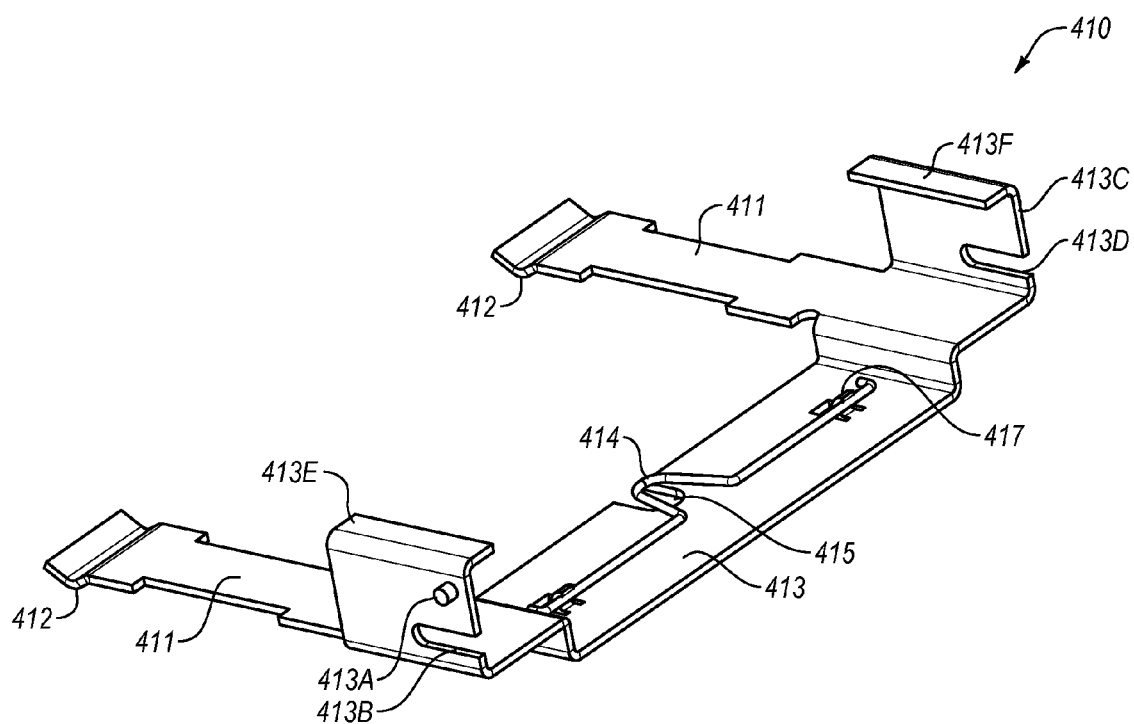
FIG. 6F is a top perspective view of the delatch assembly of FIG. 6A.

The communication module 400 may include the delatch assembly 410 (FIGS. 6E and 6F) slidably coupled to the bottom panel 401B of the housing 401. The delatch assembly 410 may include two delatch arms 411 extending parallel to one another and connected by a delatch cross-member 413. Each delatch arm 411 may define a ramp 412 configured to interact with the resilient tabs 204 of the port 200 in a similar manner as the delatch arms 311 with the resilient tabs 204.

The delatch cross-member 413 may include a left bracket 413E that includes a left bracket pin 413A and a left bracket slot 413B, and a right bracket 413F that includes a right bracket pin 413C and a right bracket slot 413D. The left and right brackets 413E, 413F may be configured to slidably engage, respectively, the left and right sidewalls 401E, 401F of the housing 401. The left and right bracket slots 413B, 413D may be configured to receive, respectively, the left and right sidewall pins 404E, 404F of the housing 401.

The delatch cross-member 413 may include a hooking member 414 and may further define a hooking slot 415, both of which may be configured to selectively engage the catch pin 403 as the delatch assembly 410 slides with respect to the housing 401, similar to the hooking member 314 and the hooking slot 315 described above. The hooking member 414 may be removably secured to the delatch cross-member 413 by hooks 417.

Figure 6G:
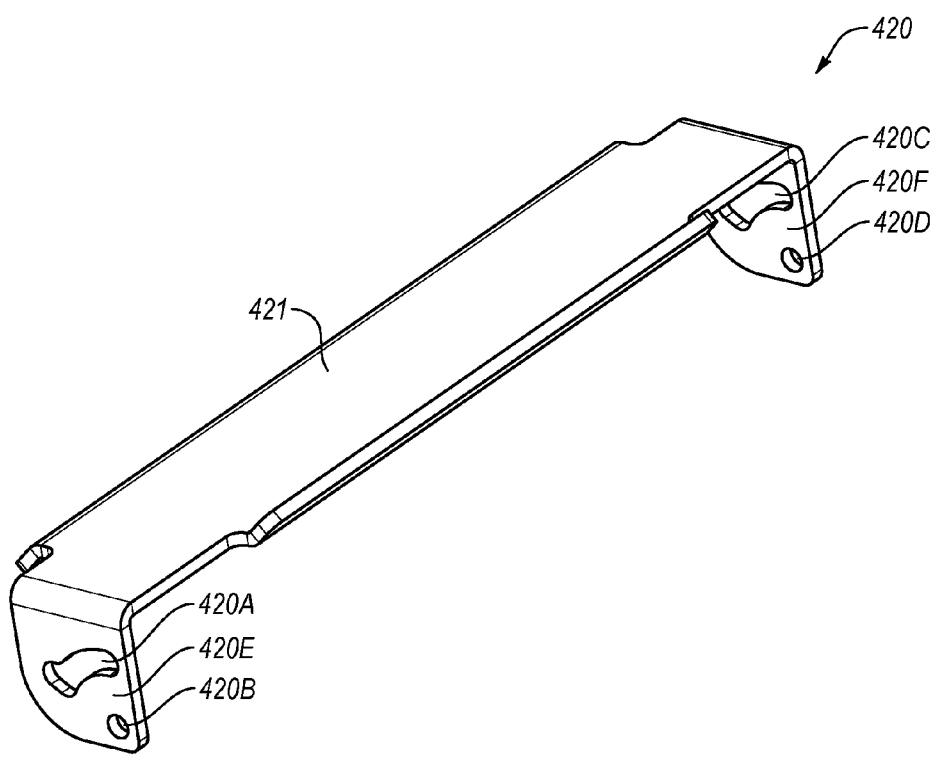
FIG. 6G is a top perspective view of the bail assembly of FIG. 6A.

The bail assembly 420 (FIGS. 6E and 6G) may be operably coupled to the delatch cross-member 413 and configured to facilitate the insertion and extraction of the communication module 400 from the port 200. The bail assembly 420 may include a bail cross-member 421, a left tab 420E that includes a left tab slot 420A and a left tab opening 420B, and a right tab 420F that includes a right tab slot 420C and a right tab opening 420D. The left and right tab slots 420A, 420C may be respectively configured to receive the left and right bracket pins 413A, 413C of the delatch assembly 410. The left and right tab openings 420B, 420D may be respectively configured to receive the left and right sidewall pins 404E, 404F of the housing 401, such that the bail assembly 420 may rotate about an axis of rotation defined by the left and right sidewall pins 404E, 404F.

Figure 7A:
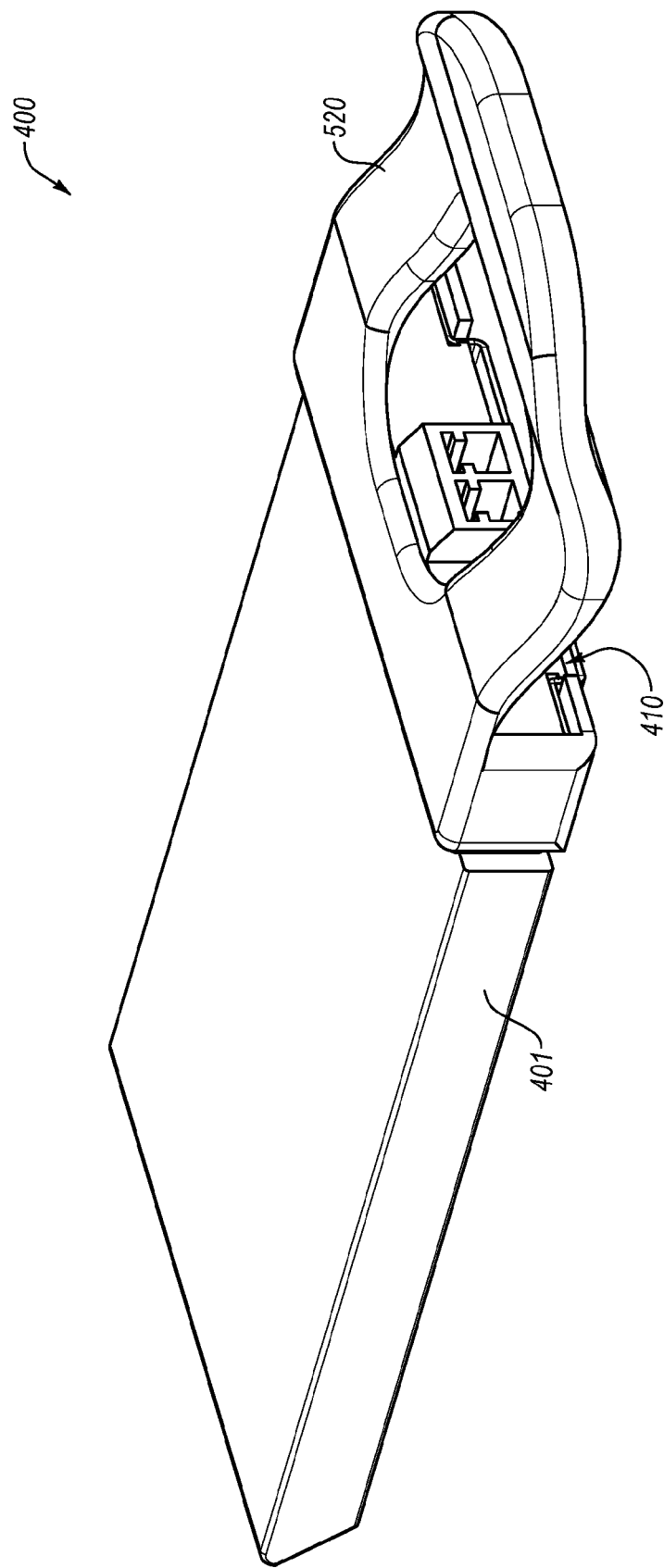
FIG. 7A is a top perspective view of the alternative example communication module of FIG. 6A including a handle.

FIG. 7A illustrates the communication module 400 including a delatch handle 520 configured to operably couple with the delatch assembly 410 in lieu of the bail assembly 420. The delatch handle 520 (FIGS. 7B and 7C) may be coupled to the left and right brackets 413E, 413F of the delatch assembly 410 and may be ergonomically molded to allow comfortable gripping of the delatch handle 520 as the communication module 400 is inserted into or extracted from the port 200.

Modifications, additions, or omissions may also be made to the components of the aforementioned embodiments without departing from the scope of the present disclosure. For example, the dimensions and/or materials of the delatch arms 311, 411 may vary in view of any number of factors, such as the weight of the communication module being supported thereon or cost considerations. The delatch assemblies 310, 410 may also have less or more delatch arms 311, 411 as needed to support the components thereon. Similarly, the dimensions and/or materials of the delatch handles 316, 520 or the bail assembly 420 may vary in view of any number of factors, such as the force required to plug and unplug the communication module or space considerations. Furthermore, the delatch handles 316, 520 or the bail assembly 420 may be removably coupled to the delatch assemblies 310, 410. The bail assembly 420 may also include a resilient element (not shown) to rotationally bias the bail assembly 420 toward either of the ends of the left and right tab slots 420A, 420C.

Figure 8A:
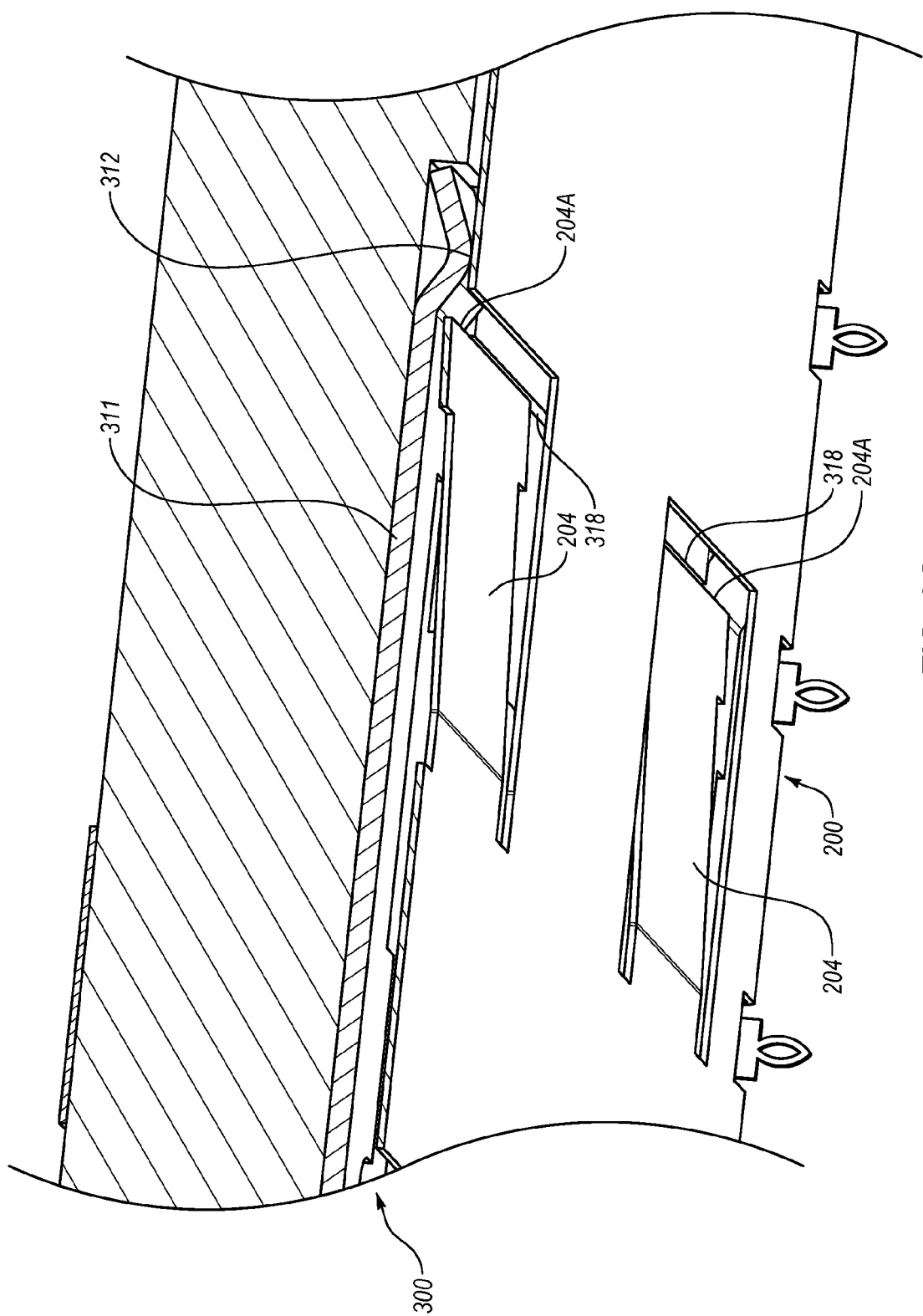
FIG. 8A is a side perspective view of the communication module of FIGS. 3A and 3B engaged within the port of FIGS. 2A and 2B.

Referring to FIGS. 1-5B and 8A, as the communication module 300 is inserted into the port 200, a pushing force applied to the delatch handle 316 of the communication module 300 may translate into rearward linear movement of the delatch assembly 310 with respect to the housing 301. The hooking slot 315 may contact the catch pin 303 as the delatch assembly 310 slides rearward along the arm guides 302 with respect to the housing 301, whereupon rearward linear movement of the delatch assembly 310 may translate into rearward linear movement of the entire communication module 300. Alternatively, the hooking slot 315 may be initially biased against or otherwise proximate to the catch pin 303 such that a sufficiently large pushing force applied to the delatch handle 316 may immediately translate into rearward linear movement of the entire communication module 300. As the communication module 300 is pushed rearward further into the port 200, the ramps 312 may contact and deflect the upwardly extending tabs 204 of the port 200 downward (e.g., toward a generally coplanar arrangement with the bottom panel 201B). With sufficient movement of the communication module 300, the ramps 312 and the shelf 318 will eventually be positioned rearward of a leading edge 204A of each of the tabs 204, as illustrated in FIG. 8A. After the ramps 312 and the shelf 318 are positioned rearward of the leading edge of the tabs 204, the tabs 204 may return to (or at least towards) their original inwardly-directed orientation. Absent operation of the ramps 312 to deflect the tabs 204 downward, the tabs 204 generally extend both inward and rearward to engage the frontward facing shelf 318 and prevent the module 300 from being removed from the port 200. In this configuration, the ramps 312 may be positioned rearward of the shelf 318.

Figure 8B:
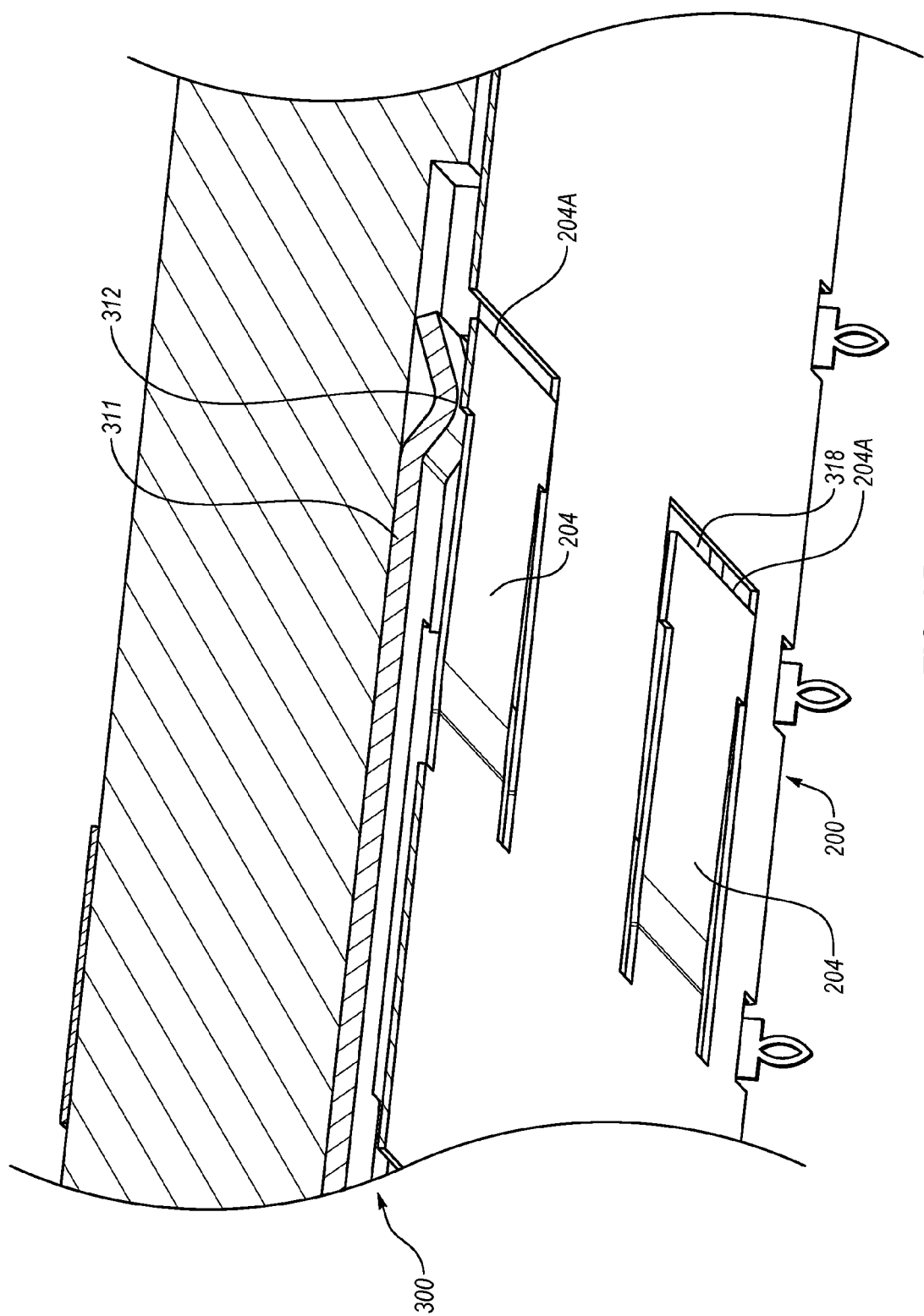
FIG. 8B is a side perspective view of the communication module of FIGS. 3A and 3B being disengaged from the port of FIGS. 2A and 2B.

Referring to FIGS. 1-5B and 8B, when the communication module 300 is fully inserted within the port 200, a pulling force applied to the delatch handle 316 of the communication module 300 may translate into forward linear movement of the delatch assembly 310 with respect to the housing 301. As the delatch arms 311 slide forward along the arm guides 302 with respect to the housing 301, the ramps 312 may contact and deflect the tabs 204 of the port 200 downward to disengage the tabs 204 from the shelf 318, as illustrated in FIG. 8B. The hooking member 314 may also contact the catch pin 303 as the delatch assembly 310 slides forward along the arm guides 302 with respect to the housing 301, whereupon forward linear movement of the delatch assembly 310 may translate into forward linear movement of the entire communication module 300 to remove the communication module 300 from the port 200.

Figure 7B:
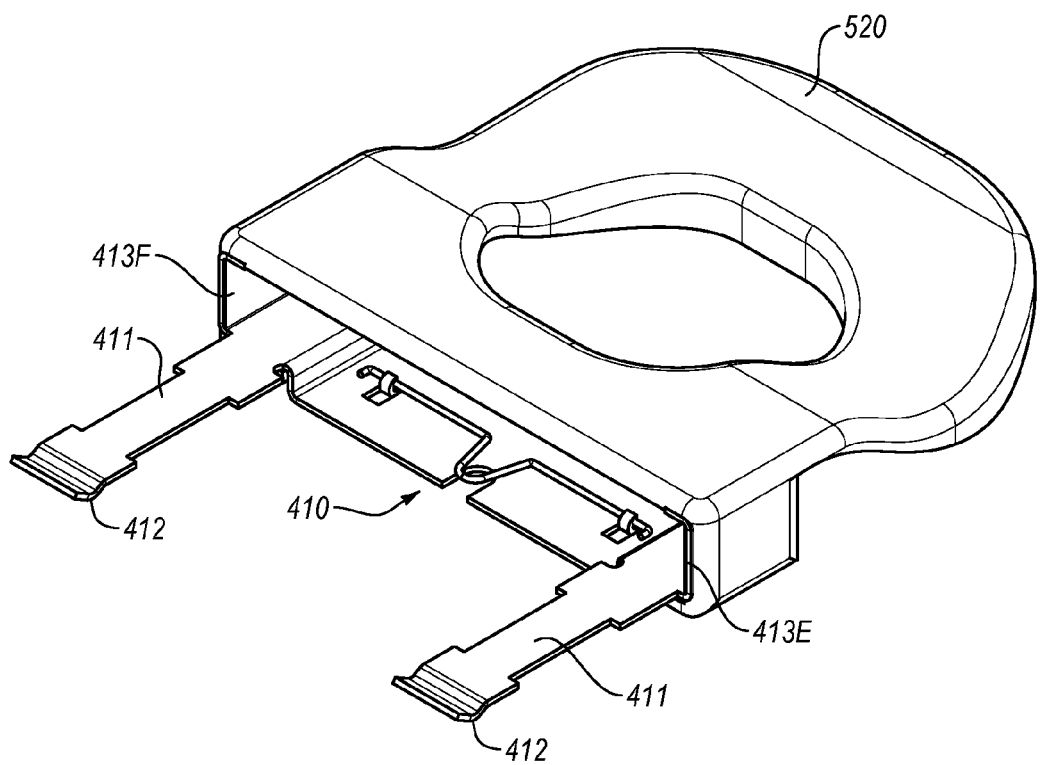
FIG. 7B is a top perspective view of the delatch assembly and handle of FIG. 7A.
Figure 7C:
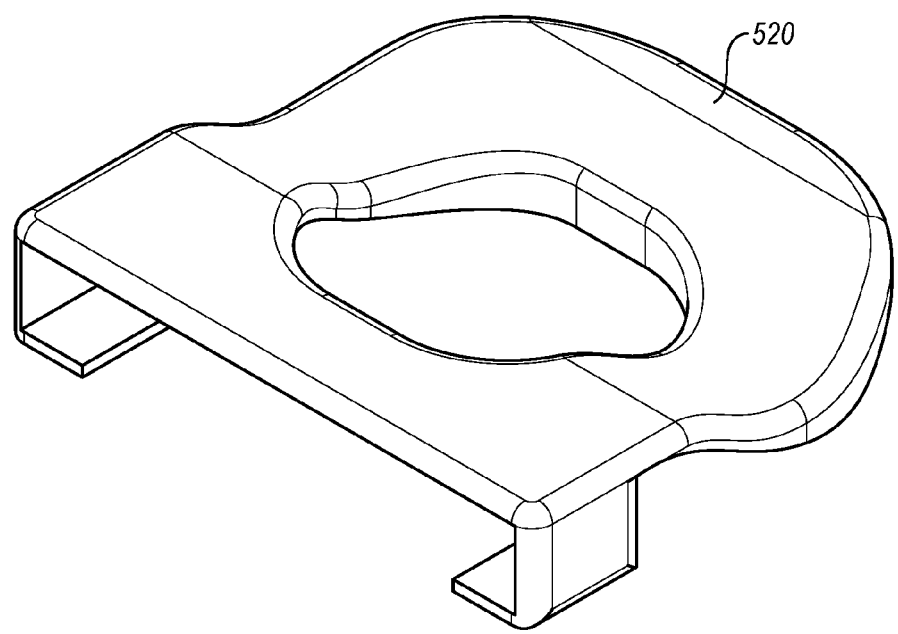
FIG. 7C is a top perspective view of the handle of FIG. 7A.

Operation of the communication module 400 of FIGS. 7A-7C with the delatch assembly 410 and the delatch handle 520 is substantially similar to operation of the communication module 300, except that insertion and removal forces may be applied to and transferred through the delatch handle 520 of FIGS. 7A-7B rather than the delatch handle 316 discussed above.

Operation of the communication module 400 of FIGS. 6A-6G with the delatch assembly 410 and the bail assembly 420 is similar in some respects to operation of the communication module 300. For example, the communication module 400 of FIGS. 6A-6G may be inserted in a generally similar manner as the communication module 300, except that an insertion force may be applied to the front face 401c, the bail assembly 420, and/or the delatch cross-member 413 to insert the communication module 400 of FIGS. 6A-6G into the port 200, rather than applying the insertion force to the delatch handle 316 as described above.

During removal of the communication module 400 of FIGS. 6A-6G, operation of the ramps 412 may be similar to operation of the ramps 312, except that forward linear movement of the ramps 412 relative to the communication module 400 may at least initially be imparted by rotational movement of the bail assembly 420 rather than by forward linear movement of the delatch handle 316 as described above. In particular, the bail assembly 420 may be rotated clockwise (in the view of FIG. 6B) about the axis of rotation defined by the left and right sidewall pins 404E, 404F of the housing 401. With sufficient rotation of the bail assembly 420, left and right tab slots 420A, 420C of the bail assembly 420 engage left and right bracket pins 413A, 413C of the delatch assembly 410, at which point further rotation of the bail assembly 420 translates to forward linear movement of the delatch assembly 410 relative to the housing 401. The left and right bracket slots 413B, 413D of the delatch assembly 410 allow the delatch assembly 410 to translate forward relative to the housing 401 without engaging the left and right sidewall pins 404E, 404F, at least within a range of linear motion of the delatch assembly 410. With the delatch assembly 410 translated forward in response to sufficient rotation of the bail assembly 420, the tabs 204 may be disengaged from the shelf 418 (as described in more detail below) to allow removal of the communication module 400 from the port 200 by application of a pulling force to the bail assembly 420.

More particularly, for the communication module 400 of FIGS. 6A-6G with the delatch assembly 410 and the bail assembly 420 (or for the communication module 400 of FIGS. 7A-7C with the delatch assembly 410 and the delatch handle 520), as the delatch arms 411 of the delatch assembly 410 slide forward along the arm guides 402 with respect to the housing 401, the ramps 412 may contact and deflect the tabs 204 of the port 200 downward to disengage the tabs 204 from the shelf 418, similar to the downward deflection of the tabs 204 from the shelf 318 by the ramps 312 as illustrated in FIG. 8B. The hooking member 414 may also contact the catch pin 403 as the delatch assembly 410 slides forward along the arm guides 402 with respect to the housing 401, whereupon forward linear movement of the delatch assembly 410 may translate into forward linear movement of the entire communication module 400 to remove the communication module 400 from the port 200.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A communication module, comprising:
   a printed circuit board that includes an edge connector configured to electrically interface the communication module with a host device that includes a port to receive the communication module;
   a housing that includes a left sidewall, a right sidewall, a top panel, a bottom panel, and a catch pin that extends from the bottom panel, wherein the housing at least partially encloses the printed circuit board; and
   a delatch assembly slidably engaged with the bottom panel of the housing, the delatch assembly comprising:
      a first delatch arm that extends longitudinally underneath the bottom panel of the housing;
      a second delatch arm spaced apart from the first delatch arm that extends longitudinally underneath the bottom panel of the housing;
      a delatch cross-member that extends laterally underneath the bottom panel of the housing between the first delatch arm and the second delatch arm; and
      a hooking member coupled to the delatch cross-member and configured to selectively engage the catch pin as the delatch assembly slides along the housing,
   wherein the first and second delatch arms are configured to selectively disengage the communication module from the port of the host device by directly contacting and deflecting first and second resilient tabs of the port away from an interference position with the communication module during disengagement of the communication module from the port.

2. The communication module of claim 1, the delatch assembly further comprising a delatch handle extending from the delatch cross-member.

3. The communication module of claim 2, wherein the delatch handle includes a flat top surface configured to receive graphic elements for categorization and organization of the communication module.

4. The communication module of claim 2, wherein the first and second delatch arms, the delatch cross-member, and the delatch handle are integrally formed as a single part.

5. The communication module of claim 2, wherein the delatch handle is removably coupled to the first and second delatch arms and the delatch cross-member.

6. The communication module of claim 1, wherein the bottom panel of the housing includes a shelf that faces toward a front face of the housing.

7. The communication module of claim 1, wherein the module substantially conforms to the CDP or CFP standard.

8. The communication module of claim 1, further comprising a transmit optical subassembly disposed within the housing.

9. The communication module of claim 1, further comprising a receive optical subassembly disposed within the housing.

10. The communication module of claim 1, further comprising one or more optical cable ports disposed along a front face of the housing, the optical cable ports each configured to optically receive a connector of a fiber-optic cable.

11. A communication module, comprising:
a printed circuit board that includes an edge connector configured to electrically interface the communication module with a host device that includes a port to receive the communication module;
a housing that includes a left sidewall, a right sidewall, a top panel, a bottom panel, and a catch pin that extends from the bottom panel, wherein the housing at least partially encloses the printed circuit board; and
a delatch assembly slidably engaged with the bottom panel of the housing, the delatch assembly comprising:
a first delatch arm that extends longitudinally underneath the bottom panel of the housing;
a second delatch arm spaced apart from the first delatch arm that extends longitudinally underneath the bottom panel of the housing;
a delatch cross-member that extends laterally underneath the bottom panel of the housing between the first delatch arm and the second delatch arm; and
a hooking member coupled to the delatch cross-member and configured to selectively engage the catch pin as the delatch assembly slides along the housing, wherein:
the first and second delatch arms are configured to selectively disengage the communication module from the port of the host device;
the first delatch arm includes a first ramp configured to removably engage with a first resilient tab of the port;
the second delatch arm includes a second ramp configured to removably engage with a second resilient tab of the port;
the first ramp is configured to urge the first resilient tab away from the housing as the communication module is inserted into or removed from the port; and
the second ramp is configured to urge the second resilient tab away from the housing as the communication module is inserted into or removed from the port.

12. The communication module of claim 11, wherein the first and second resilient tabs of the port extend into a cavity defined by the port.

13. The communication module of claim 11, wherein the port includes one or more integrated heatsink springs configured to bias a heatsink of the host device downward against the communication module when the communication module is engaged within the port.

14. The communication module of claim 11, further comprising a delatch handle that extends from the delatch cross-member, the left bracket, and the right bracket.

15. The communication module of claim 14, wherein the delatch handle is ergonomically molded to allow comfortable grip of the delatch handle.

16. A communication module, comprising:
a printed circuit board that includes an edge connector configured to electrically interface the communication module with a host device that includes a port to receive the communication module;
a housing that includes a left sidewall, a right sidewall, a top panel, a bottom panel, and a catch pin that extends from the bottom panel, wherein the housing at least partially encloses the printed circuit board; and
a delatch assembly slidably engaged with the bottom panel of the housing, the delatch assembly comprising:
a first delatch arm that extends longitudinally underneath the bottom panel of the housing;
a second delatch arm spaced apart from the first delatch arm that extends longitudinally underneath the bottom panel of the housing;
a delatch cross-member that extends laterally underneath the bottom panel of the housing between the first delatch arm and the second delatch arm; and
a hooking member coupled to the delatch cross-member and configured to selectively engage the catch pin as the delatch assembly slides along the housing, wherein:
the first and second delatch arms are configured to selectively disengage the communication module from the port of the host device;
the housing further comprises a left sidewall pin disposed on the left sidewall and a right sidewall pin disposed on the right sidewall; and
the delatch assembly further comprises:
a left bracket slidably engaged with the left sidewall of the housing, the left bracket including a left bracket pin and defining a left bracket slot configured to receive the left sidewall pin; and
a right bracket slidably engaged with the right sidewall of the housing, the right bracket including a right bracket pin and defining a right bracket slot configured to receive the right sidewall pin.

17. The communication module of claim 16, wherein:
the delatch assembly further comprises a bail assembly that includes:
a bail cross-member;
a left tab that includes a left tab slot configured to receive the left bracket pin and a left tab opening configured to receive the left sidewall pin; and
a right tab that includes a right tab slot configured to receive the right bracket pin and a right tab opening configured to receive the right sidewall pin,
wherein the bail assembly is configured to rotate about the left and right sidewall pins along a path defined by the left and right tab slots.

18. The communication module of claim 17, further comprising a resilient element configured to rotationally bias the bail cross-member toward the top panel of the housing.

19. The communication module of claim 16, further comprising a delatch handle that extends from the delatch cross-member, the left bracket, and the right bracket.

20. The communication module of claim 19, wherein the delatch handle is ergonomically molded to allow comfortable grip of the delatch handle.

* * * * *